United States Patent [19]
Isaksson

[11] Patent Number: 5,382,810
[45] Date of Patent: Jan. 17, 1995

[54] OPTOELECTRONIC COMPONENT

[75] Inventor: Jan Isaksson, Täby, Sweden

[73] Assignee: Asea Brown Boveri AB, Västerås, Sweden

[21] Appl. No.: 104,127

[22] PCT Filed: Feb. 4, 1992

[86] PCT No.: PCT/SE93/00064
§ 371 Date: Aug. 16, 1993
§ 102(e) Date: Aug. 16, 1993

[87] PCT Pub. No.: WO92/16021
PCT Pub. Date: Sep. 17, 1992

[30] Foreign Application Priority Data
Feb. 27, 1991 [SE] Sweden .............................. 9100560

[51] Int. Cl.⁶ ...................... H01L 23/02; H01L 23/12
[52] U.S. Cl. ........................................ 257/81; 257/98; 257/99; 257/435; 257/433
[58] Field of Search .................. 257/80, 81, 82, 98, 257/99, 100, 433, 434, 680, 710, 435, 436

[56] References Cited
U.S. PATENT DOCUMENTS
3,816,847  6/1974  Nagao ..................... 257/98
3,914,786 10/1975  Grossi .................... 257/99

FOREIGN PATENT DOCUMENTS
58-119681  7/1983  Japan ..................... 257/99
61-263268 11/1986  Japan ..................... 257/81
62-73785   4/1987  Japan .
2-205080   8/1990  Japan ..................... 257/98

Primary Examiner—Jerome Jackson
Assistant Examiner—John F. Guay
Attorney, Agent, or Firm—Watson, Cole, Grindle & Watson

[57] ABSTRACT

An optoelectronic component has an LED (5) and a photodetector (6) mounted on a base (1). A housing has lenses (11, 12) for transmission of emitted/received light. A building block (13) of thin metal plate has a plurality of legs (16, 17) which, when mounting the housing on the base, are squeezed between the housing and the base and provide a mechanical locking of these two units in the desired position in relation to each other. The building element (13) has a bent-down screen portion and/or electrical screening of the semiconductor elements (5, 6) from each other. (FIG. 1a)

16 Claims, 9 Drawing Sheets

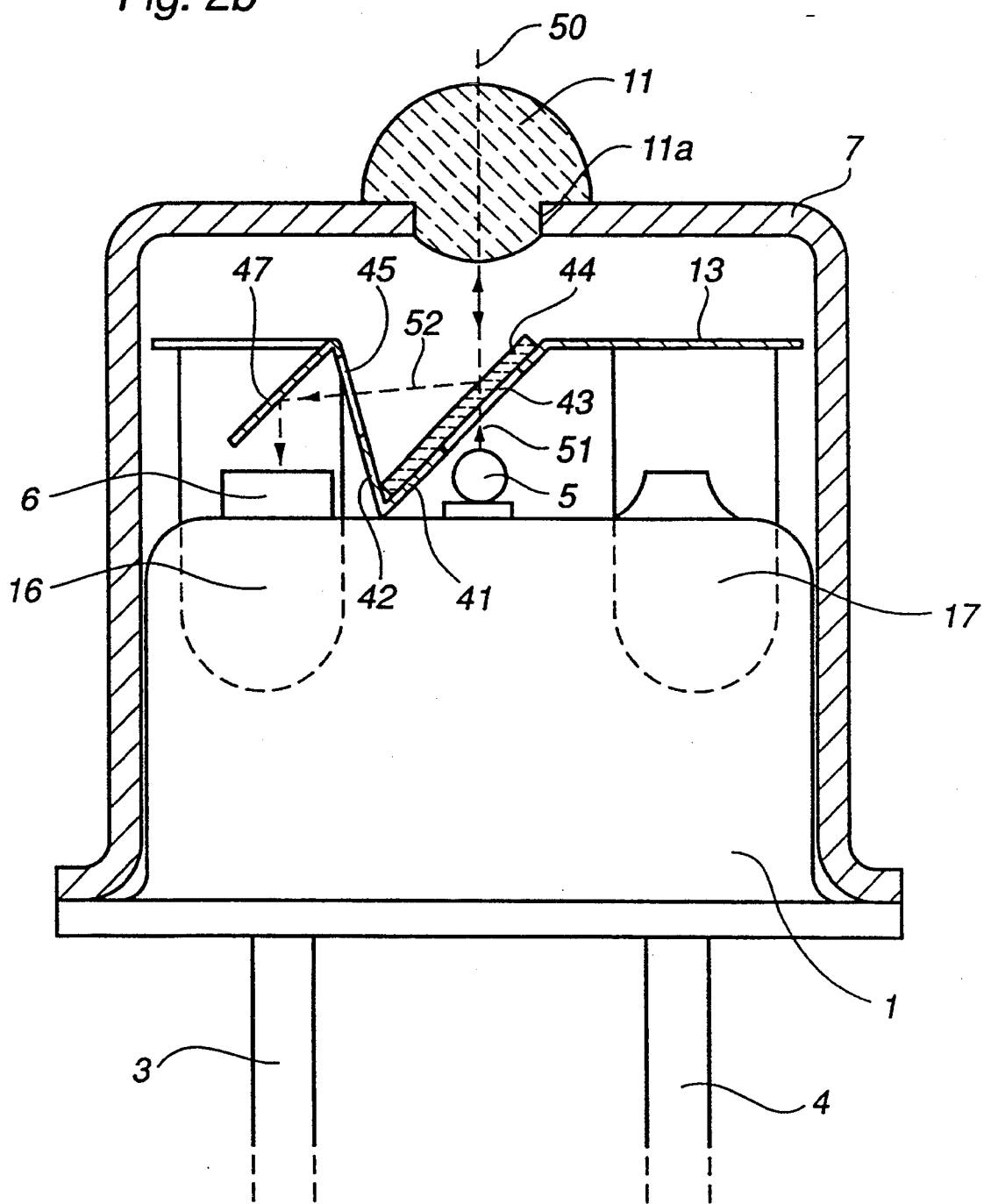

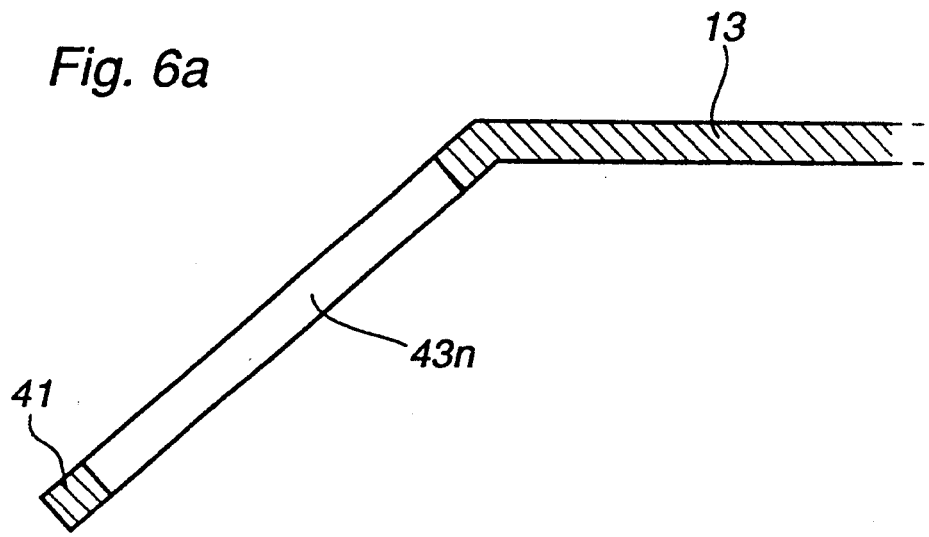
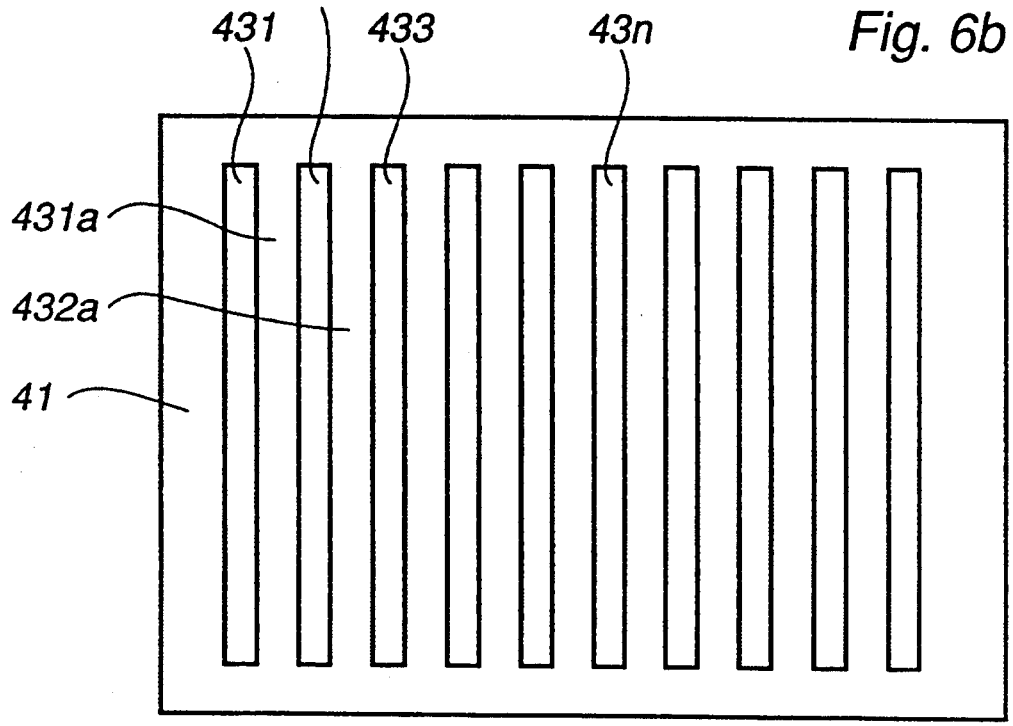

OPTOELECTRONIC COMPONENT

TECHNICAL FIELD

The present invention relates to an optoelectronic component comprising a number of light-emitting and-/or light-receiving semiconductor elements which are arranged on a base, as well as a housing which surrounds the base and together with this forms a closed casing for the semiconductor elements.

BACKGROUND ART

It is previously known to mount optoelectronic components so-called transistor casings. A commonly used such casing comprises a round base, on one plane surface of which one several optoelectronic semiconductor elements is or are arranged. After mounting of the semiconductor element or the semiconductor elements on the base, a similarly round housing is fitted over the base and connected thereto, for example by welding the joint. In connection with casings of this kind, there must be a certain play between the housing and the base. This makes it possible for the position of the housing relative to the base to be changed in an uncontrolled manner between the fitting of the housing on the base and the subsequent welding of the housing to the base. In, for example, such optoelectronic components which comprise a plurality of semiconductor elements with separate light openings or lenses, a rotation of the housing relative to the base, after the fitting of the housing in the desired position, means that the function of the component is reduced or that the component is rendered incapable of functioning. Also in case of components which, in principle, are rotationally symmetrical with one single centrally arranged semiconductor element and with one centrally arranged light opening or lens in the housing, an accurate centering of the housing in relation to the base is often required. Because of a play between the housing and the base, a displacement of the position of the housing relative to the base may easily occur between the fitting of the housing and the subsequent welding to the base. This makes it impossible to attain the desired accurate centering.

For the above reasons, the manufacture of components of the kind described above has either required extra time- and cost-demanding manufacturing stages to ensure the desired relative position between the housing and the base, or the manufacture has resulted in a high percentage of defective components.

Certain optoelectronic components comprise a light-emitting semiconductor element for emitting light to the surroundings as well as a light-receiving element for receiving light from the surroundings. In this type of components, it is of the utmost importance that direct radiation between the light-emitting and the light-receiving semiconductor elements is eliminated, and to attain a rational and economical manufacture it is of importance that this direct radiation can be eliminated in a manner which is both simple and favourable from the manufacturing point of view.

Certain other types of optoelectronic components, so-called optocouplers, comprise a light-emitting and a light-receiving semiconductor element, between which signals are transmitted optically to avoid a galvanic connection between the circuits to which the two semiconductor elements are connected. In such a component, it is a requirement that as large a part as possible of the radiation emitted from the light-emitting semiconductor element reaches the light-receiving semiconductor element. It is known to arrange certain types of reflecting members for controlling the radiation between the two semiconductor elements. However, such members tend to increase the complexity and the manufacturing cost of a component, and it is desirable that the desired control of the radiation can be made in the simplest and economically most favorable way.

Certain other types of optoelectronic components are intended for bidirectional signal transmission, for example through an optical fiber. A typical such component comprises a light-emitting semiconductor element and a light-receiving semiconductor element, which respectively emit and receive optical radiation through a common opening or lens in the housing. In this type of components there are problems in obtaining the required screening of direct radiation between the semiconductor elements as well as in causing emitted light from the light-emitting semiconductor element to be passed out through the common opening or lens in the desired direction and with a high efficiency while at the same time light falling against the component is passed with good efficiency to the light-receiving semiconductor element. Attaining these objectives at the same time has proved to be difficult and to give rise to complicated and hence uneconomical solutions.

SUMMARY OF THE INVENTION

The invention aims to provide a component of the kind described in the introduction, in which, in a simple manner, an efficient locking of the housing in the desired position between the fitting of the housing onto the base and the welding of the housing to the base, performed in a subsequent manufacturing stage, is obtained. The invention also aims to provide a component in which the desired screening or control of the radiation between semiconductor elements present in the housing can be achieved in a simple manner.

Further, the invention aims to provide a component in which the control of the light flow between one or more openings or lenses in the housing and the semiconductor elements arranged in the housing can be achieved in a simple manner.

What characterizes an optoelectronic component according to the invention will be clear from the appended claims.

BRIEF DESCRIPTION OF THE DRAWINGS

In the following the invention will be described in greater detail with reference to the accompanying FIGS. 1–6. FIG. 6 shows how the partially reflecting members, used in FIG. 2b and FIG. 5, can be achieved in an alternative way by openings in the building block included in the component.

DESCRIPTION OF THE PREFERRED EMBODIMENTS

Figure 1A:
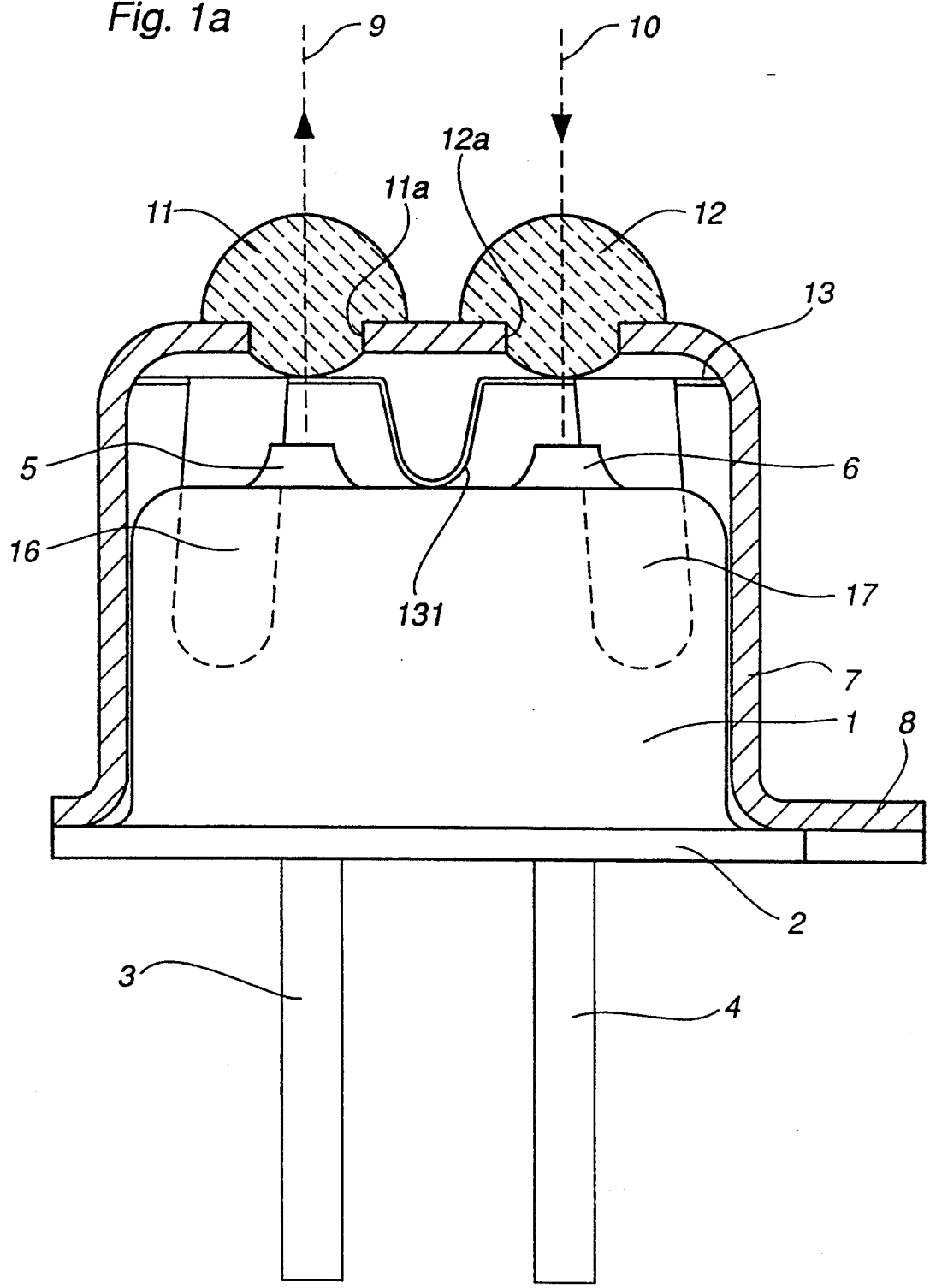
FIG. 1a shows a section through a so-called reflection detector according to the invention.

FIG. 1 shows a so-called reflection detector according to the invention. It comprises a light-emitting semiconductor 5, for example an LED or a laser diode, as well as a light-detecting member 6, for example a photodiode or a phototransistor, for detection of such emitted radiation which is reflected from an object located outside the component. The semiconductor elements are mounted on the plane surface of a rotationally symmetrical base 1, which is provided with a flange 2 and leads 3 and 4. A housing 7, also of rotationally symmetrical shape, is fitted on the base and forms together with this a closed casing for the semiconductor elements. The housing is welded to the flange 2 of the base. Straight in front of the semiconductor elements 5 and 6 the housing is provided with openings 11a, 12a, which are provided with lenses 11, 12 for focussing the radiation. A central light ray from the element is designated 9 in the figure and a central light ray received by the element 6 designated 10.

By the concept "light" in this application is meant optical radiation, both within and outside the visible wavelength band.

For locking the housing to the base in the desired position prior to welding the housing to the base, and for screening of direct radiation between the two semiconductor elements of the components, a building block 13 is arranged in the component. The building block has four legs, of which the legs 16 and 17 are shown in FIG. 1a, as well as a screen portion 131 for screening the direct radiation.

The building block 13 is made of a thin metal plate, for example a copper beryllium alloy, and has the thickness 50 μm. The plate is etched out with the shape shown in FIG. 1b. The building block has the four legs 16, 17, 18, 19 and two openings 22, 23 to let through light to and from the two semiconductor elements, respectively. 24 designates the symmetry line of the building block, which will coincide with the centre of the screen portion 131. 26 and 27 designate the edges of the prospective screen portion.

Figure 1B:
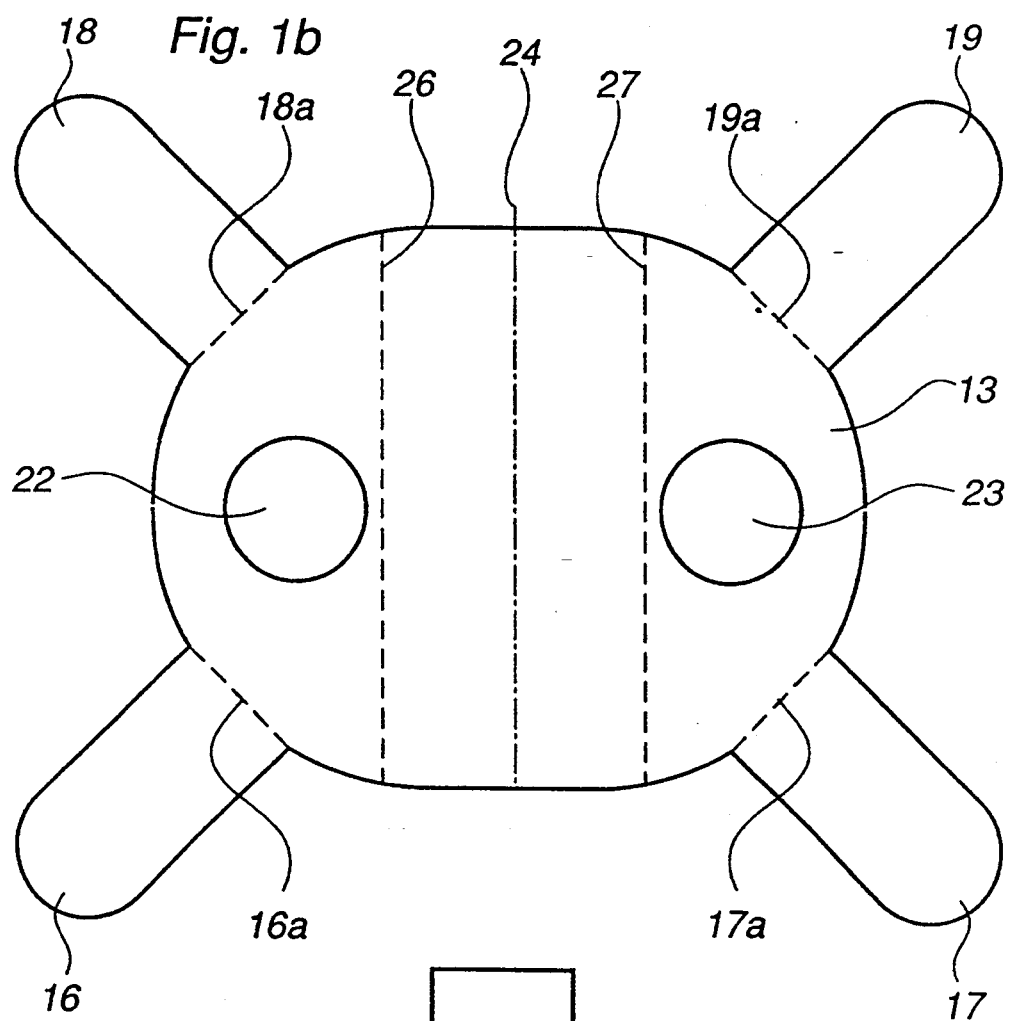
FIG. 1b shows the shape of the building block which is included in the component according to FIG. 1a, FIG. 1c shows a side view of the building block
Figure 1C:
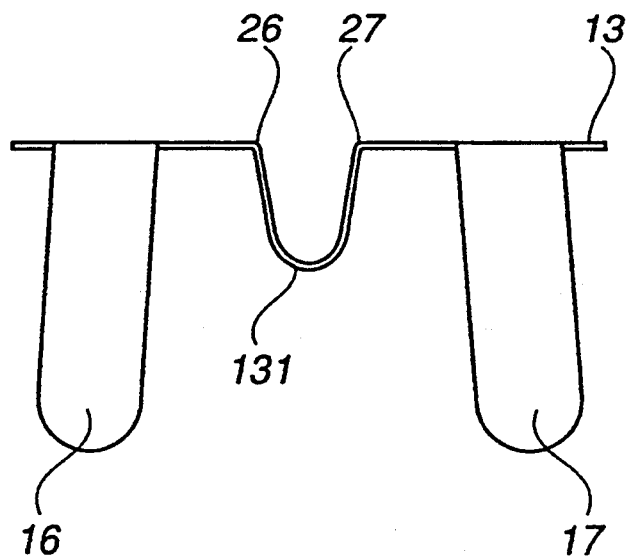
FIG. 1d shows the building block seen in a direction which coincides with the symmetry axis of the component.
Figure 1D:
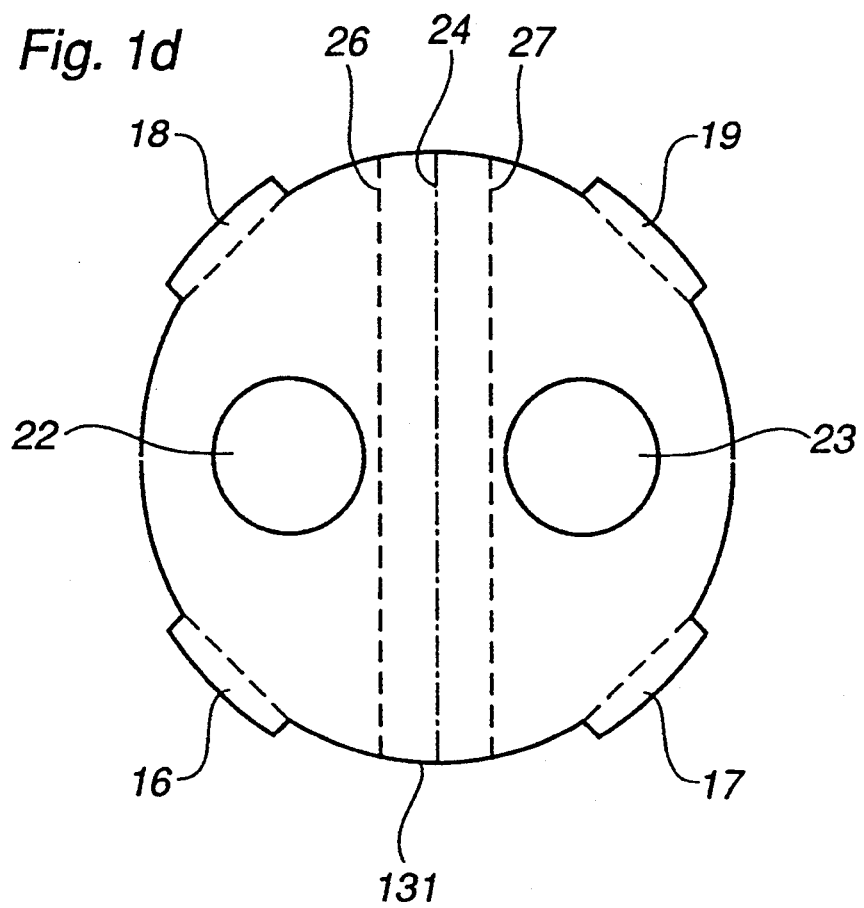

After manufacture of the plate shown in FIG. 1b, this is pressed into the desired shape in a suitable fixture (FIGS. 1c and 1d). The pressing is performed such that the four legs of the element are folded down into a right angle, to a near right angle in relation to the plane main portion of the element (at the dashed lines 16a, 17a, 18a, 19a in FIG. 1b), and further such that the central part of the plate is bent down and forms the screen portion 131. After the pressing, the building block may suitably be hardened and then becomes resilient. When mounting the optoelectronic component according to the invention, the semiconductor elements 5, 6 are first applied to the base 1, whereafter the building block 13 is fitted on the base so far that the screen portion 131 will make contact with the base. Thereafter, the housing 7 is applied on the base and adjusted such that the lenses 11, 12 assume the desired position in relation to the semiconductor elements 5, 6. When fitting the housing, the four legs 16–19 of the building to block 13 are squeezed in between the housing and the base and, because of the resilience in the legs, lock the housing in the desired position in relation to the base up to the point when the final welding of the housing to the base takes place. The legs also provide a centering of the housing relative to the base and efficiently prevent the symmetry axes of these two units from being displaced relative to each other because of a play between the housing and the base.

The screen portion 131 of the building block provides a complete optical screening of the two semiconductor elements from each other, that is, prevents radiation from the element 5 from reaching element 6. To further secure this effect, the building block may suitably be provided with a suitable light-absorbing coating or surface treatment, for example by means of black chromium plating.

According to an alternative embodiment of the mounting procedure described above, the building block 13 can be pressed into the housing 7 prior to the fitting of the housing on the base.

Figure 2A:
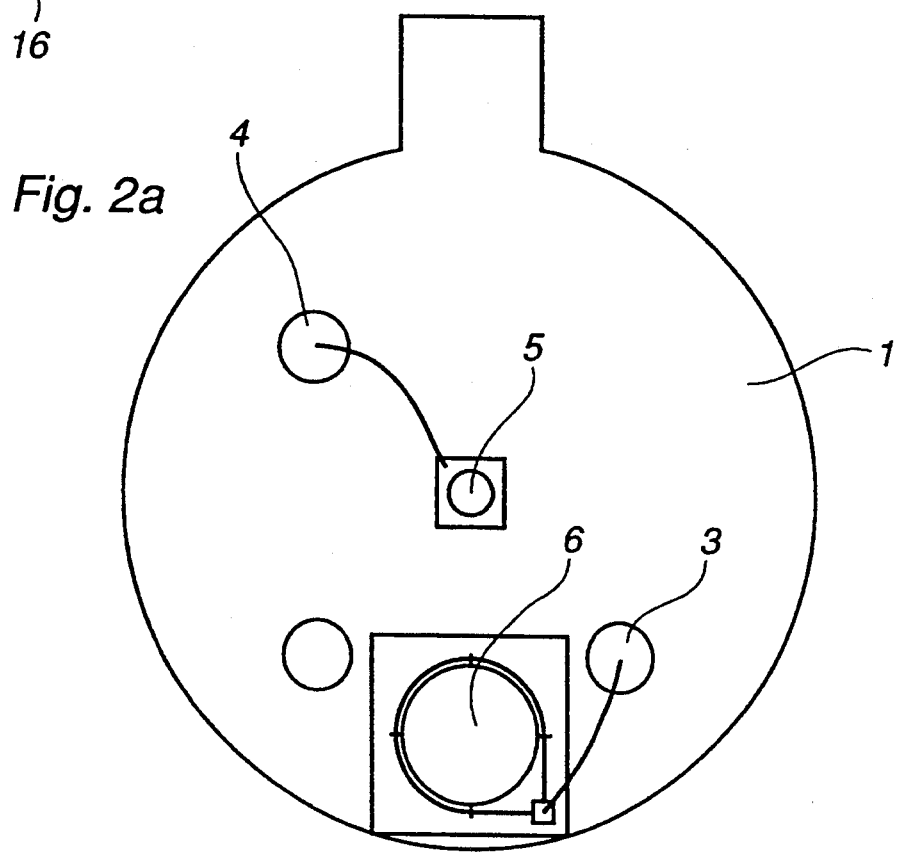
FIG. 2 shows a component for bidirectional (duplex) signal transmission, FIG. 2a showing the surface of the base with the semiconductor elements placed thereon, FIG. 2b showing a section through the component.

FIG. 2a and FIG. 2b show a component according to the invention intended for bidirectional optical signal transmission, for example through an optical fibre (a light guide). FIG. 2a shows the plane surface of the base 1 with the leads 3 and 4. Centrally on the base an LED or a laser diode 5 is arranged, and displaced towards the edge of the base a photodiode or a phototransistor 6 is arranged. The housing 7 has an opening 11a common to the two components, the opening being provided with a lens 11, for example for optical coupling between the component and a light guide.

In the same way as the component according to FIG. 1, the component shown in FIG. 2 has a building block 13 with legs 16, 17 etc. for locking the housing to the base during to the mounting. Similarly, the building block has a bent-down portion which is arranged between the two semiconductor elements and which makes contact with the base 1. This portion has plane side walls 41 and 42. In the wall 41 an opening 43 is provided for letting through light from the element 5 in a direction towards the lens 11. The opening is covered with a partially reflecting (semi-transparent) member, for example a glass plate 44 provided with a layer which provides the desired reflection/transmission. Radiation 51 emitted from the element 5 passes the opening 43 and partially the glass plate 44 and exits through the lens 11 (only a central ray 50 is shown). Light 50 falling against the component is partially reflected in the glass plate 44 (the ray 52) and passes through an opening 45 in the second side wall 42 of the screen portion. After passage through the opening, the light is reflected in a bent-down part 47 of the building block 13 towards the light-receiving semiconductor element 6. The reflecting surface of the portion 47 may suitably be provided with a highly reflecting coating, for example of gold, to increase the reflective power.

The walls 41 and 42 of the screen portion can in a simple manner be given such a shape that they efficiently prevent direct radiation from the element 5 from reaching the element 6. Also in this case, the entire building block 13 (except the reflecting part of portion 47) is suitably coated with a suitable light-absorbing coating, for example achieved by means of black chromium plating.

Figure 3A:
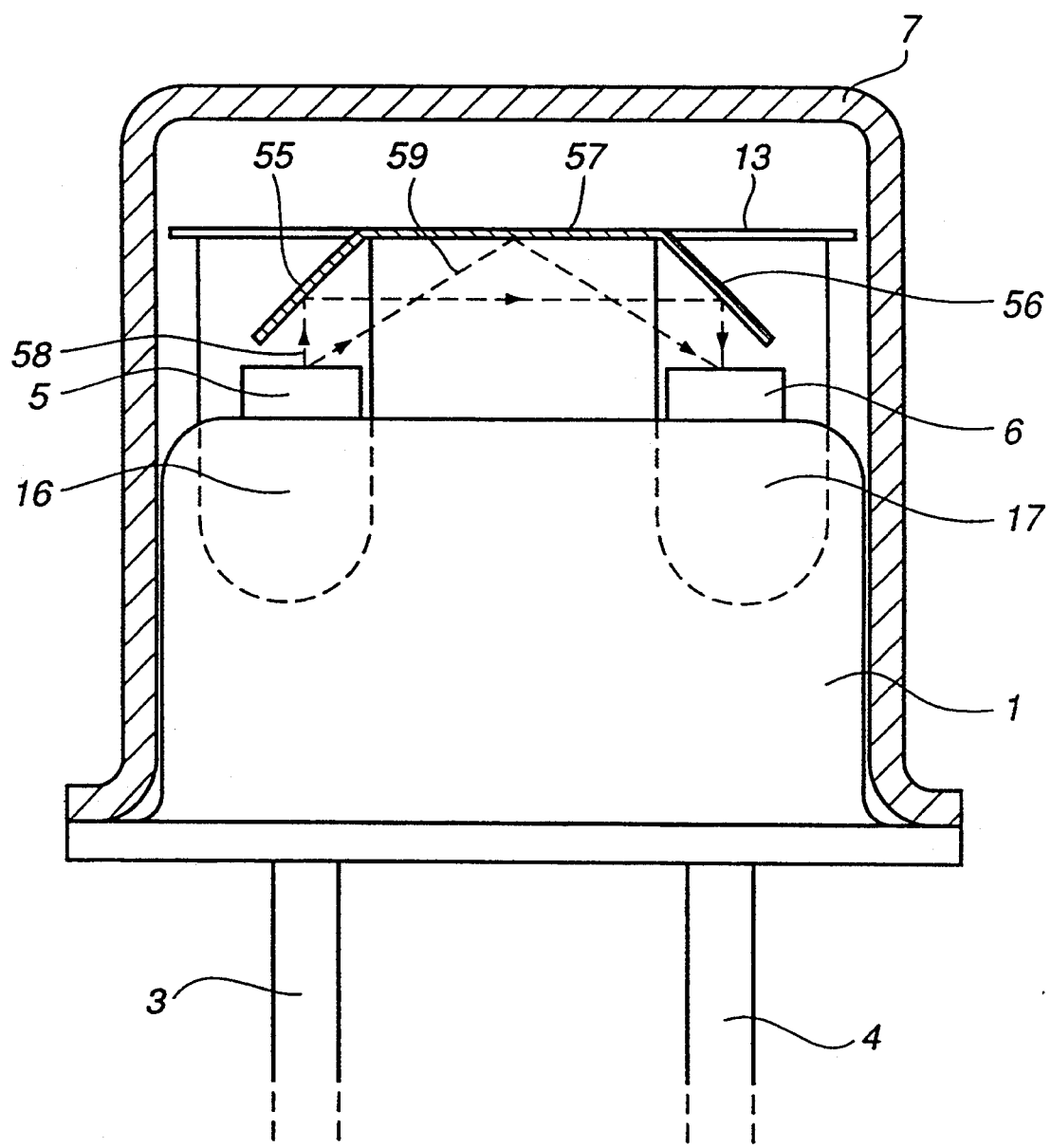
FIG. 3a and FIG. 3b show two alternative embodiments of an optocoupler according to the invention.

FIG. 3a shows an optocoupler for galvanically separated signal transmission between two electric circuits. One of the circuits is connected to a light-emitting semiconductor element 5 and the other circuit to a light-receiving semiconductor element 6. The building block 13 is provided with bent-down portions 55, 56, the surfaces of which facing the semiconductor elements are coated with a reflective coating, for example gold, as is that surface of the central part 57 of the building block which faces the semiconductor elements. Ligh rays 58, 59 emitted from the element 5 will be reflected in the building block and with high efficiency reach the light-receiving element 6.

Figure 3B:
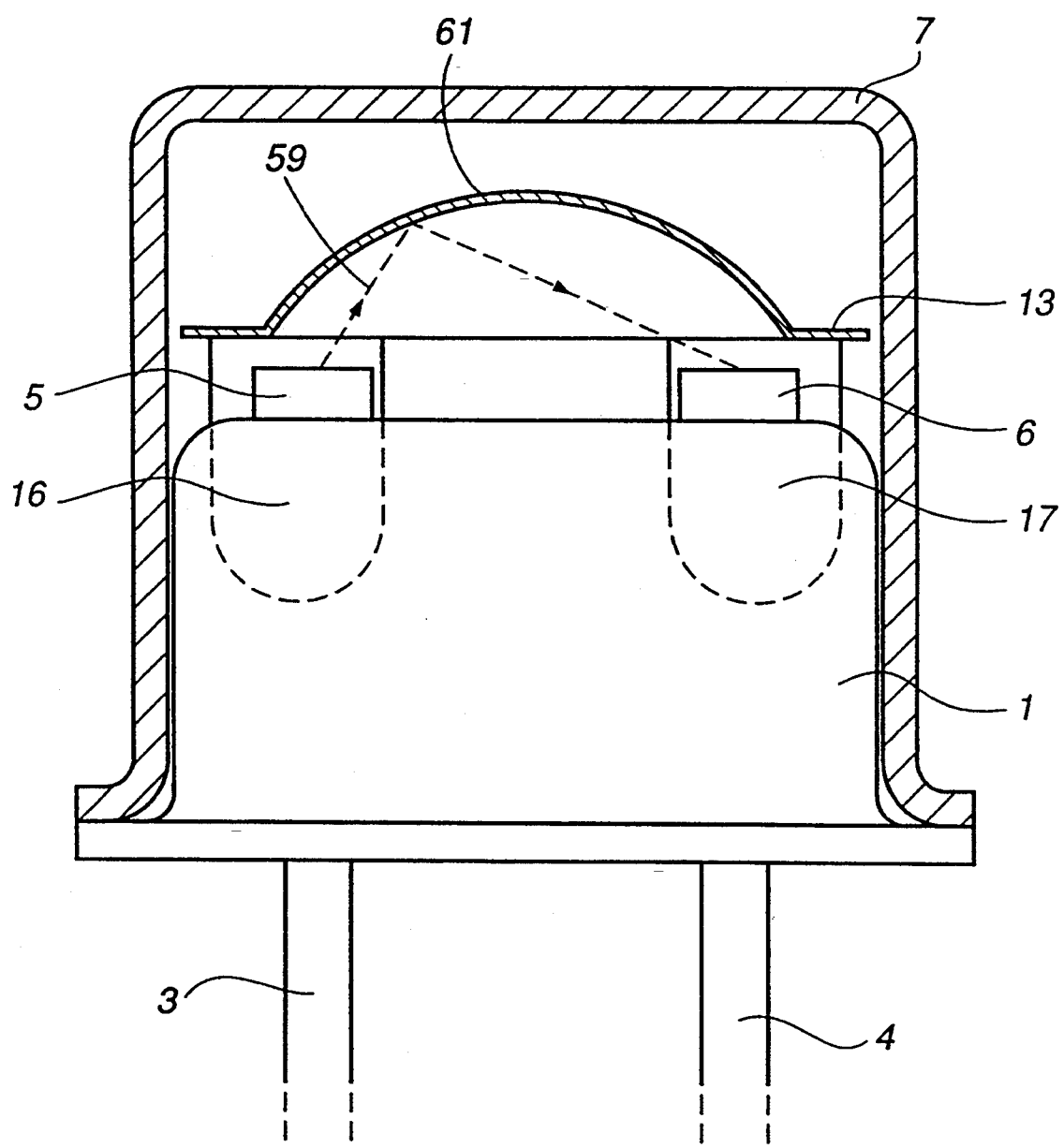

FIG. 3b shows an alternative embodiment of the building block 13 in an optocoupler. The building block is here provided with a central dome-shaped part 61, produced, for example, by pressing. That part of the dome-shaped part which faces the semiconductor elements is coated with a reflective coating and reflects emitted light with high efficiency. This results in a very good optical coupling between the two semiconductor elements of the component.

Figure 4:
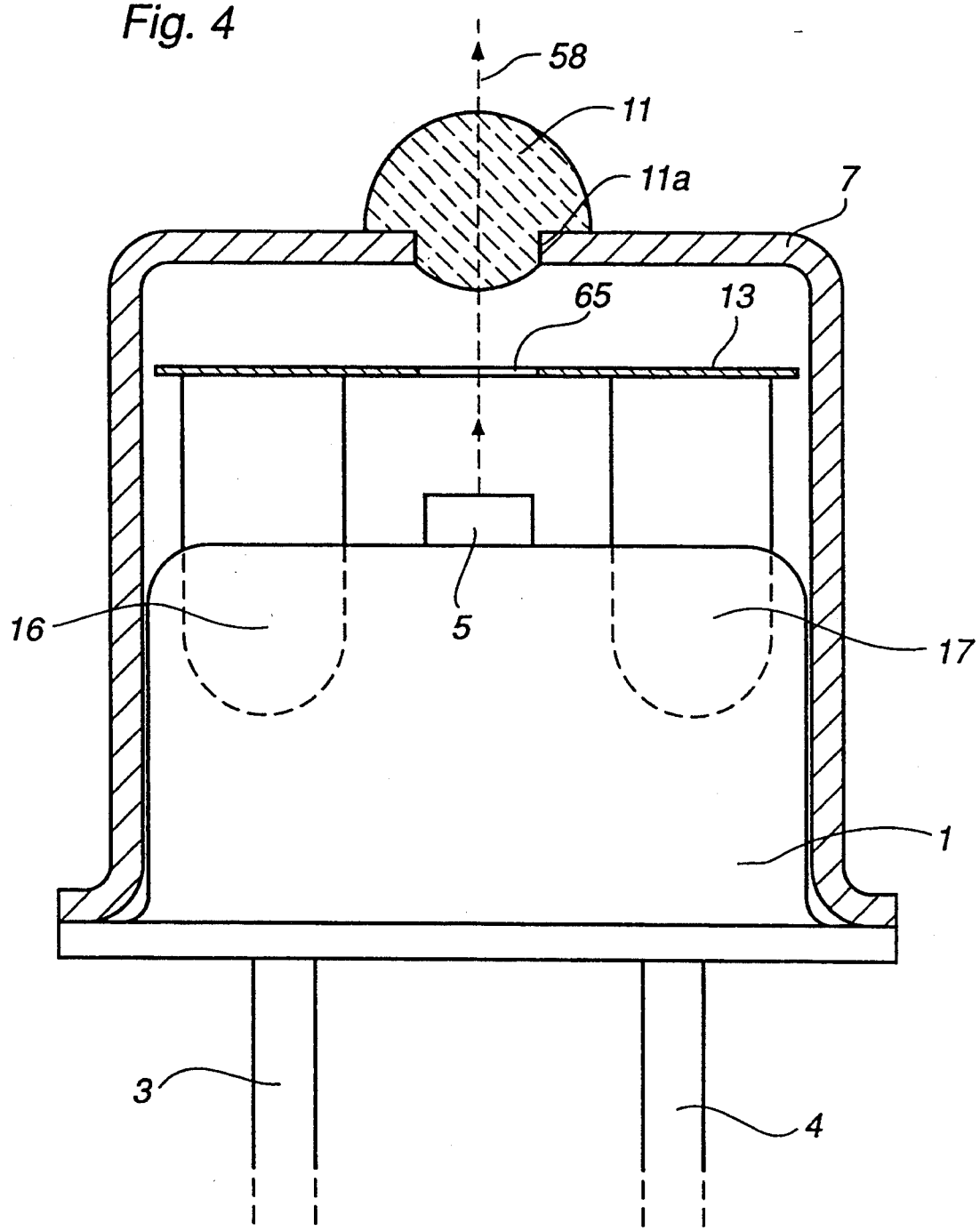
FIG. 4 shows a component according to the invention, which comprises a light emitting diode (LED).

FIG. 4 shows a component according to the invention with a light-emitting semiconductor element 5. The building block 13 is provided with a central opening 65 to admit radiation 58 from the element 5 towards the lens 11. Here the building block 13 has no function other than the one mentioned in the introductory part, that is, the function of providing a mechanical locking and centering of the housing to the base during the manufacture. Alternatively, of course, the light-emitting semiconductor element 5 may consist of a light-receiving semiconductor element.

Figure 5:
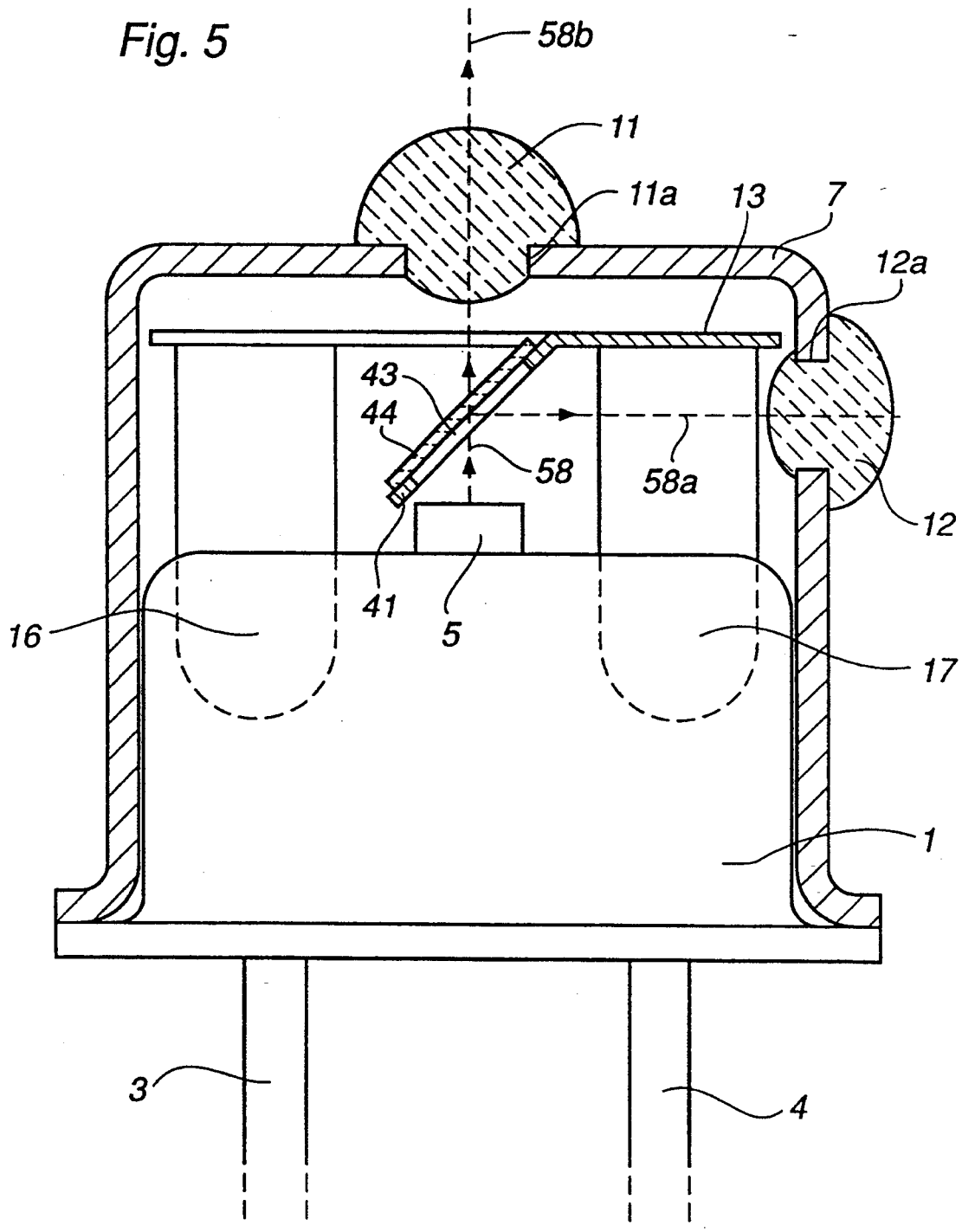
FIG. 5 shows a component according to the invention with an LED adapted to emit light through two separate exit openings in the housing.

FIG. 5 shows a component according to the invention with one single light-emitting element 5 adapted simultaneously to emit light in two different directions through different openings in the housings. The housing has the openings 11a and 12a, in which the lenses 11 and 12 are arranged. The building block 13 has a bent-down portion 41 with an opening 43 and a semi-transparent mirror 44, for example a thin glass plate. Radiation 58 emitted from the element 5 is partially reflected by the glass plate 44 to the right in the figure out through the lens 12 (ray 58a) and is partially transmitted by the glass plate 44 in a direction towards the lens 11 (ray 58b). In the embodiment shown in FIG. 5, the light-emitting element 5 may be replaced by a light-receiving element, in which case the component can be used for receiving radiation from two different directions.

FIG. 2b and FIG. 5 show partially reflecting members, which consist of a thin glass plate 44. FIG. 6 shows how the corresponding function can be obtained in an alternative way. FIG. 6a shows a section through the deflected portion 41 of the building block 13 in the same plane as the sections shown in FIG. 2b and FIG. 5. FIG. 6b shows the deflected portion 41 seen from the left in FIG. 2b and FIG. 5. The deflected portion 41 is provided with a number of parallel longitudinal slits 431, 432, 433, etc. Through these slits light can be transmitted straight through the portion 41 without changing direction. Part of the light falling against the portion 41 hits the portions 431a, 432a etc. between the slits and is reflected. To attain increased reflection, the reflecting surface may suitably be coated, for example with a thin gold layer. The slits may, for example, be produced simultaneously with the cutting of the metal plate which constitutes the base for the building block 13. In this way, the desired partially reflecting (semi-transparent) function of the building block can be obtained in a very simple way. As an alternative to the elongated slits shown in FIG. 6, the portion 41 may be provided with a number of openings of another shape, for example circular holes.

Since the building block 13 is metallically connected to the base 1 and the housing 7, also an improved electrical screening between the two elements is obtained in those embodiments (e.g. the one shown in FIG. 1) which have a screen portion (131) arranged between two semiconductor elements.

I claim:

1. An optoelectronic component comprising at least one light-emitting or light-receiving semiconductor element which is arranged on a base, and a housing surrounding the base and forming together therewith a closed casing for said at least one semiconductor element, wherein the component comprises a building block having a plurality of legs shaped such that, when fitting the housing on the base, the legs are clamped between the base and the housing for centering and locking the housing in relation to the base.

2. An optoelectronic component according to claim 1, wherein the building block consists of a metal plate.

3. An optoelectronic component according to claim 2, wherein the legs consist of folded-down parts of the metal plate.

4. An optoelectronic component according to claim 1, comprising two semiconductor elements arranged on the base, wherein the building block has a screen portion, arranged between the semiconductor elements, which is designed so as to prevent direct light transmission between the elements.

5. An optoelectronic component according to claim 4, wherein the screen portion consists of a bent-down part of the metal plate.

6. An optoelectronic component according to claim 1, wherein the building block is provided with wholly or partially reflecting parts for guiding the direction of light emitted from or falling against said at least one semiconductor element.

7. An optoelectronic component according to claim 6, wherein the wholly or partially reflecting parts consist of a mirror mounted on the building block.

8. An optoelectronic component according to claim 6, wherein said reflecting parts consist of one or more reflecting surfaces of the building block.

9. An optoelectronic component according to claim 6, wherein said at least one semiconductor element comprises a first light-emitting semiconductor element and a second light-receiving semiconductor element for optical transmission of signals from the first to the second semiconductor element, wherein said reflecting parts of the building block are adapted for reflection of light emitted from the first semiconductor element toward the second semiconductor element.

10. An optoelectronic component according to claim 6, in which the housing has at least one opening for light transmission between said at least one semiconductor element and the surroundings, wherein the wholly or partially reflecting parts of the building block are adapted for guiding the path of the light between said at least one semiconductor element and the opening.

11. An optoelectronic component according to claim 1, wherein said at least one semiconductor element comprises a light-emitting semiconductor element and a light-receiving semiconductor element which transmit light therebetween through a common opening in the housing, wherein the building block has partially reflecting members, arranged in the light transmission path between said light-emitting semiconductor element and said light-receiving semiconductor element and the opening, for guiding the path of the light between the two semiconductor elements and the opening.

12. An optoelectronic component according to claim 11, wherein the partially reflecting member is arranged in the direct light path between one of the semiconductor elements and the opening and at an angle with said light path, and that the building block has a reflecting member arranged in the light path between the other semiconductor element and the partially reflecting member.

13. An optoelectronic component according to claim 1, in which said at least one semiconductor element either emits or receives light through at least two different openings in the housing, wherein the building block is provided with partially reflecting members for guiding the path of the light between the semiconductor element and the openings.

14. An optoelectronic component according to claim 11, wherein the partially reflecting member consists of a partially reflecting mirror.

15. An optoelectronic component according to claim 14, wherein the mirror consists of a glass plate.

16. An optoelectronic component according to claim 11, wherein the partially reflecting member consists of a reflecting portion of the building block provided with a plurality of openings.

* * * * *

UNITED STATES PATENT AND TRADEMARK OFFICE
CERTIFICATE OF CORRECTION

PATENT NO. : 5,382,810
DATED : January 17, 1995
INVENTOR(S) : Jan Isaksson

It is certified that error appears in the above-indentified patent and that said Letters Patent is hereby corrected as shown below:

On the title page item [86], should read --PCT No.: PCT/SE92/00064

Signed and Sealed this

Fourteenth Day of March, 1995

Attest:

BRUCE LEHMAN

Attesting Officer

Commissioner of Patents and Trademarks